(12) United States Patent
Inoto et al.

(10) Patent No.: US 11,355,495 B2
(45) Date of Patent: Jun. 7, 2022

(54) SEMICONDUCTOR DEVICE

(71) Applicants: Kabushiki Kaisha Toshiba, Tokyo (JP); Koshiba Electronic Devices & Storage Corporation, Tokyo (JP)

(72) Inventors: Hidekazu Inoto, Ota Tokyo (JP); Osamu Takata, Yokohama Kanagawa (JP); Naozumi Terada, Kawasaki Kanagawa (JP); Hiroyoshi Kitahara, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 325 days.

(21) Appl. No.: 16/748,035

(22) Filed: Jan. 21, 2020

(65) Prior Publication Data
US 2021/0066295 A1  Mar. 4, 2021

(30) Foreign Application Priority Data
Aug. 26, 2019 (JP) .............................. JP2019-153475

(51) Int. Cl.
 *H01L 27/092* (2006.01)
(52) U.S. Cl.
 CPC ................................. *H01L 27/0928* (2013.01)
(58) Field of Classification Search
 None
 See application file for complete search history.

(56) References Cited

U.S. PATENT DOCUMENTS

| | | | |
|---|---|---|---|
| 7,468,615 B1* | 12/2008 | Tan ................ | H03K 19/018528 327/333 |
| 10,200,043 B2* | 2/2019 | Koudate .......... | H03K 3/356113 |
| 2003/0151109 A1* | 8/2003 | Taniguchi ....... | H01L 21/823468 257/E21.639 |
| 2006/0268653 A1* | 11/2006 | Umezawa ......... | H01L 27/11529 257/E21.691 |
| 2007/0229137 A1 | 10/2007 | Nishimura | |
| 2014/0306319 A1* | 10/2014 | Torii .................... | H01L 21/761 257/547 |
| 2017/0213831 A1* | 7/2017 | Nakai ................. | H01L 27/0925 |
| 2018/0262189 A1* | 9/2018 | Kakubari .............. | H03K 17/06 |
| 2018/0277625 A1* | 9/2018 | Takahashi ........... | H01L 29/1083 |

FOREIGN PATENT DOCUMENTS

| | | |
|---|---|---|
| JP | 3211773 B2 | 9/2001 |
| JP | 4021395 B2 | 12/2007 |
| JP | 5030373 B2 | 9/2012 |

* cited by examiner

*Primary Examiner* — Bilkis Jahan
(74) *Attorney, Agent, or Firm* — Allen & Overy LLP (57) ABSTRACT

A semiconductor device includes first to sixth transistors of enhancement type. The first and fourth transistors are of p-channel type. The second, third, fifth and sixth transistors are of n-channel type. A breakdown voltage of the third transistor is lower than a breakdown voltage of the second transistor. A breakdown voltage of the sixth transistor is lower than a breakdown voltage of the fifth transistor. The first to third transistors are connected in series between a first power supply potential and a second power supply potential lower than the first power supply potential. The fourth to sixth transistors are connected in series between the first power supply potential and the second power supply potential.

10 Claims, 5 Drawing Sheets

FIG. 4A
HOLE-ELECTRON PAIR GENERATION

FIG. 4B
RECOMBINATION

FIG. 4C
ELECTRON MOVEMENT

FIG. 4D
HOLE MOVEMENT AND ENTRAPMENT

SEMICONDUCTOR DEVICE

CROSS-REFERENCE TO RELATED APPLICATIONS

This application is based upon and claims the benefit of priority from Japanese Patent Application No. 2019-0153475, filed on Aug. 26, 2019; the entire contents of which are incorporated herein by reference.

FIELD

Embodiments relate to a semiconductor device.

BACKGROUND

Conventionally, a semiconductor device has been manufactured in which a level shift circuit converting a voltage is provided. In such a semiconductor device, it is desirable for the level shift circuit to operate stably over a long period of time.

DETAILED DESCRIPTION

A semiconductor device according to an embodiment, includes an n-type well, a p-type well, first to fourth layers provided on the n-type well, fifth to twelfth layers provided on the p-type well, first to sixth gate electrodes, a first gate insulating film, a second gate insulating film, and first to eighth interconnects. The first to fourth layers are of a p-type. The fifth to twelfth layers are of an n-type. The first gate electrode is provided in a region directly above a region of the n-type well between the first layer and the second layer. The second gate electrode is provided in a region directly above a region of the n-type well between the third layer and the fourth layer. The third gate electrode is provided in a region directly above a region of the p-type well between the fifth layer and the sixth layer. The fourth gate electrode is provided in a region directly above a region of the p-type well between the seventh layer and the eighth layer. The fifth gate electrode is provided in a region directly above a region of the p-type well between the ninth layer and the tenth layer. The sixth gate electrode is provided in a region directly above a region of the p-type well between the eleventh layer and the twelfth layer. The first gate insulating film is provided between the n-type well and the first gate electrode, between the n-type well and the second gate electrode, between the p-type well and the third gate electrode, and between the p-type well and the fourth gate electrode. The second gate insulating film is provided between the p-type well and the fifth gate electrode and between the p-type well and the sixth gate electrode. The second gate insulating film is thinner than the first gate insulating film. The first interconnect is connected to the n-type well, the first layer, and the third layer. The second interconnect is connected to the fourth layer, the eighth layer, and the first gate electrode. The third interconnect is connected to the second layer, the sixth layer, and the second gate electrode. The fourth interconnect is connected to the fifth layer and the tenth layer. The fifth interconnect is connected to the third gate electrode and the fifth gate electrode. The sixth interconnect is connected to the seventh layer and the twelfth layer. The seventh interconnect is connected to the fourth gate electrode and the sixth gate electrode. The eighth interconnect is connected to the p-type well, the ninth layer, and the eleventh layer.

A semiconductor device according to an embodiment, includes first to sixth transistors of enhancement type. The first and fourth transistors are of p-channel type. The second, third, fifth and sixth transistors are of n-channel type. A breakdown voltage of the third transistor is lower than a breakdown voltage of the second transistor. A breakdown voltage of the sixth transistor is lower than a breakdown voltage of the fifth transistor. A first power supply potential is applied to a source of the first transistor. A drain of the second transistor is connected to a drain of the first transistor. A first input signal is input to a gate of the second transistor. A drain of the third transistor is connected to a source of the second transistor. A second power supply potential is lower than the first power supply potential and is applied to a source of the third transistor. The first input signal is input to a gate of the third transistor. A source of the fourth transistor is connected to the first power supply potential. A drain of the fourth transistor is connected to a gate of the first transistor. A gate of the fourth transistor is connected to a drain of the first transistor. A drain of the fifth transistor is connected to a drain of the fourth transistor. A second input signal is complimentary to the first input signal and is input to a gate of the fifth transistor. A drain of the sixth transistor is connected to a source of the fifth transistor. The second power supply potential is applied to a source of the sixth transistor. The second input signal is input to a gate of the sixth transistor. A first output signal is output from a drain of the fourth transistor. A second output signal is output from a drain of the first transistor and is complimentary to the first output signal.

Embodiments of the invention will now be described.

Figure 1:
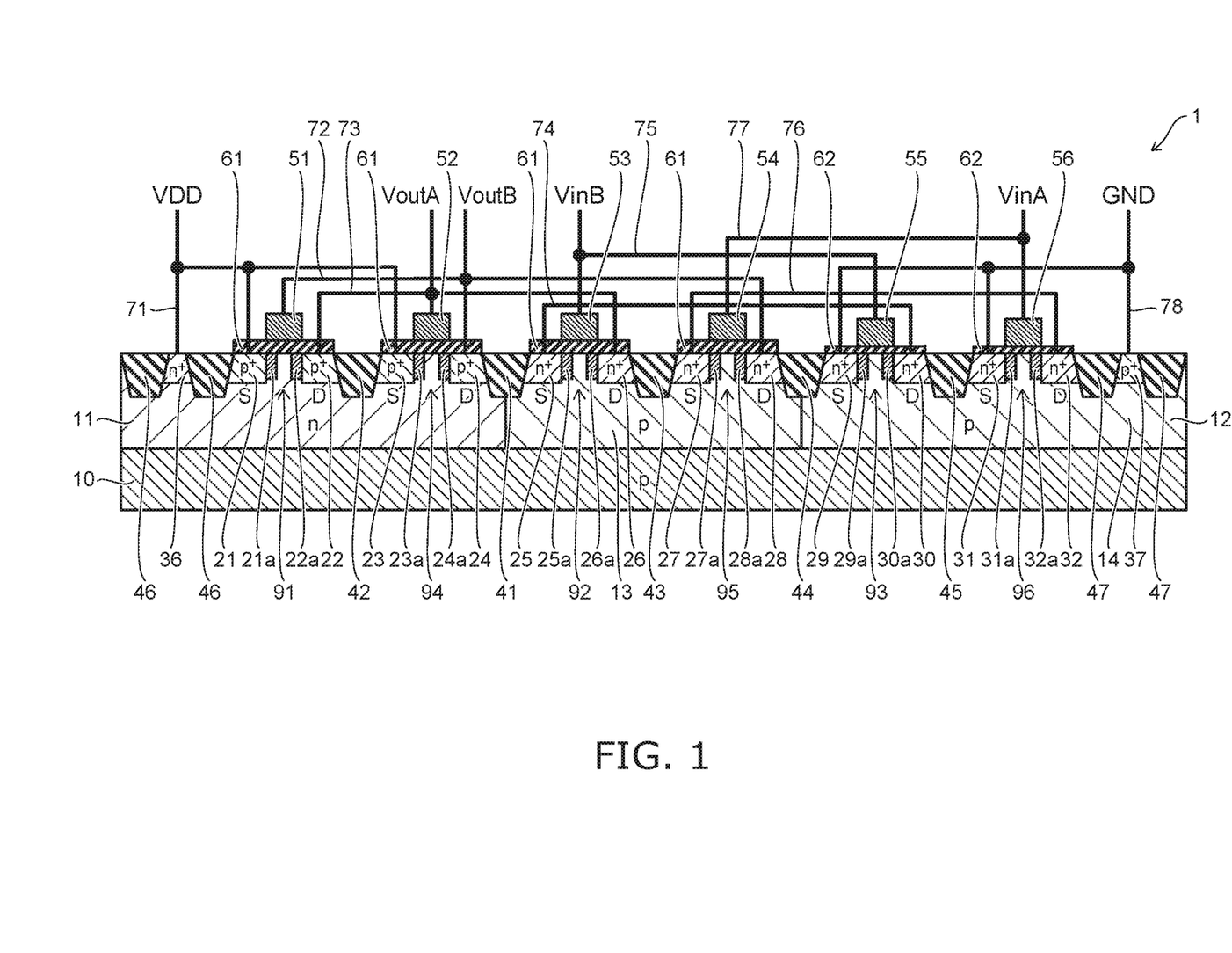
FIG. 1 is a cross-sectional view schematically showing a semiconductor device according to an embodiment.

FIG. 1 is a cross-sectional view schematically showing a semiconductor device according to the embodiment.

Figure 2:
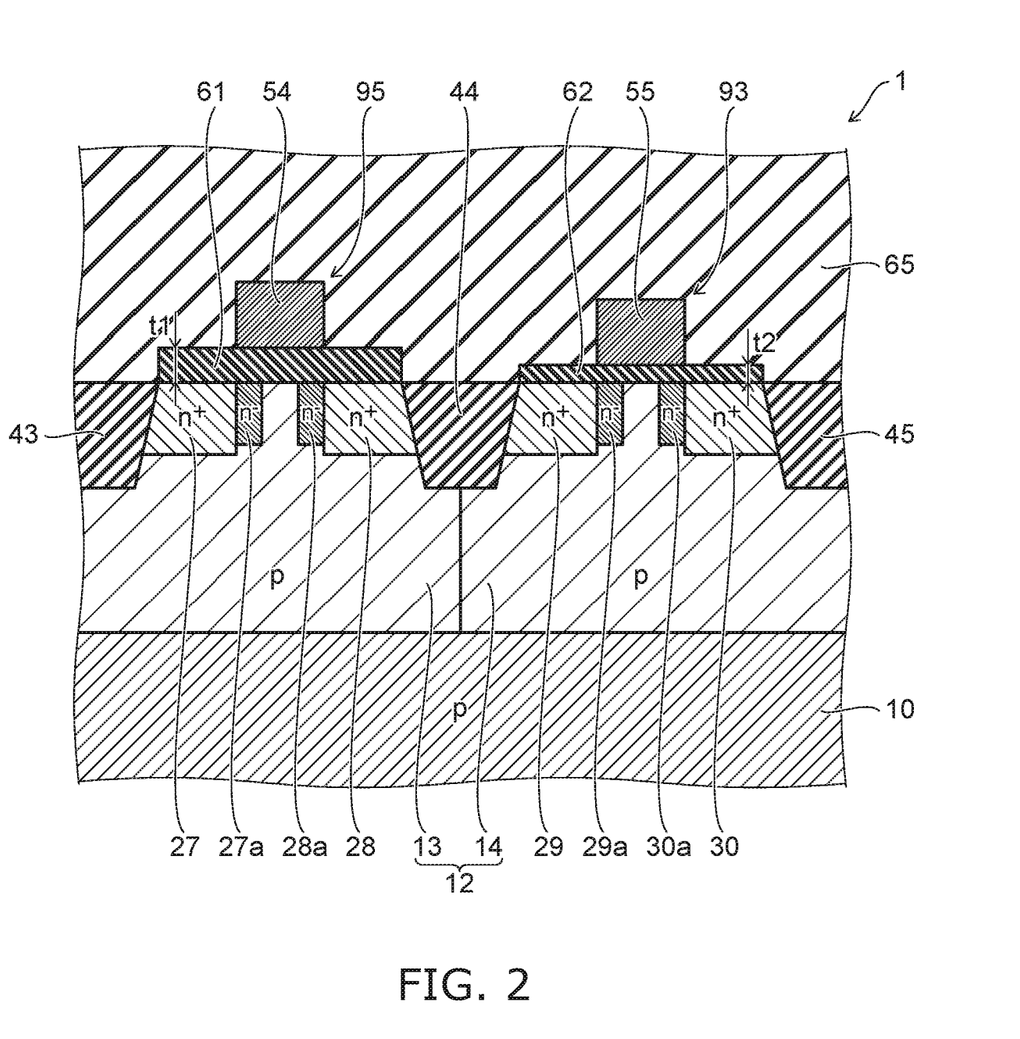
FIG. 2 is a partially enlarged cross-sectional view showing the semiconductor device according to the embodiment.

FIG. 2 is a partially enlarged cross-sectional view showing the semiconductor device according to the embodiment.

As shown in FIG. 1, for example, a semiconductor substrate 10 of a p-conductivity type is provided in the semiconductor device 1 according to the embodiment. An n-type well 11 of an n-conductivity type is provided in a portion on the semiconductor substrate 10. A p-type well 12 of the p-conductivity type is provided in another portion on the semiconductor substrate 10. In the following description, "p$^+$-type" refers to a p-conductivity type having a higher impurity concentration than that of the "p-type"; and "p$^-$-type" refers to a p-conductivity type having a lower impurity concentration than that of the "p-type." This is similar for the n-type as well.

A high breakdown voltage region 13 and a low breakdown voltage region 14 are provided in the p-type well 12. The impurity concentration of the high breakdown voltage region 13 is equal to or lower than the impurity concentration of the low breakdown voltage region 14. For example, the high breakdown voltage region 13 is disposed between the n-type well 11 and the low breakdown voltage region 14. For example, the high breakdown voltage region 13 contacts the n-type well 11 and the low breakdown voltage region 14.

$p^+$-type layers 21 to 24 of the $p^+$-conductivity type are provided to be separated from each other on the n-type well 11. The impurity concentrations of the $p^+$-type layers 21 to 24 are higher than the impurity concentration of the p-type well 12. $n^+$-type layers 25 to 28 of the $n^+$-conductivity type are provided to be separated from each other on the high breakdown voltage region 13 of the p-type well 12. $n^+$-type layers 29 to 32 of the $n^+$-conductivity type are provided on the low breakdown voltage region 14 of the p-type well 12. The impurity concentrations of the $n^+$-type layers 25 to 32 are higher than the impurity concentration of the n-type well 11. The impurity concentrations of the $n^+$-type layers 25 to 28 are substantially equal to the impurity concentrations of the $n^+$-type layers 29 to 32. An $n^+$-type contact layer 36 of the $n^+$-conductivity type is formed in the n-type well 11. A $p^+$-type contact layer 37 of the $p^+$-conductivity type is formed in the p-type well 12.

For example, the semiconductor substrate 10, the n-type well 11, the p-type well 12, the $p^+$-type layers 21 to 24, the $n^+$-type layers 25 to 32, the $n^+$-type contact layer 36, and the $p^+$-type contact layer 37 are formed of a semiconductor material and are formed as an integral body of single-crystal silicon (Si).

At least six transistors, i.e., first to sixth transistors 91 to 96, are formed in the semiconductor device 1. The first to sixth transistors 91 to 96 are enhancement mode MOSFETs (Metal-Oxide-Semiconductor Field-Effect Transistors).

As described below, among these transistors, the first transistor 91 and the fourth transistor 94 are p-channel transistors provided in the n-type well 11. The second transistor 92 and the fifth transistor 95 are n-channel transistors provided in the high breakdown voltage region 13 of the p-type well 12. The third transistor 93 and the sixth transistor 96 are n-channel transistors provided in the low breakdown voltage region 14 of the p-type well 12. The breakdown voltage of the third transistor 93 is lower than the breakdown voltage of the first transistor 91 and the breakdown voltage of the second transistor 92. The breakdown voltage of the sixth transistor 96 is lower than the breakdown voltage of the fourth transistor 94 and the breakdown voltage of the fifth transistor 95.

The $p^+$-type layer 21 and the $p^+$-type layer 22 respectively are the source and the drain of the p-channel first transistor 91. The $p^+$-type layer 23 and the $p^+$-type layer 24 respectively are the source and the drain of the p-channel fourth transistor 94. The $n^+$-type layer 25 and the $n^+$-type layer 26 respectively are the source and the drain of the n-channel second transistor 92. The $n^+$-type layer 27 and the $n^+$-type layer 28 respectively are the source and the drain of the n-channel fifth transistor 95. The $n^+$-type layer 29 and the $n^+$-type layer 30 respectively are the source and the drain of the n-channel third transistor 93. The $n^+$-type layer 31 and the $n^+$-type layer 32 respectively are the source and the drain of the n-channel sixth transistor 96. In FIG. 1, the position that corresponds to the source of each transistor is shown by the reference numeral "S"; and the position that corresponds to the drain of each transistor is shown by the reference numeral "D."

A LDD (Lightly Doped Drain) region 21a of the $p^-$-conductivity type is formed at a portion of the $p^+$-type layer 21 opposing the $p^+$-type layer 22. The impurity concentration of the LDD region 21a is lower than the impurity concentration of the $p^+$-type layer 21. A LDD region 22a of the $p^-$-conductivity type is formed at a portion of the $p^+$-type layer 22 opposing the $p^-$-type layer 21. Similarly, LDD regions 23a and 24a of the $p^-$-conductivity type are formed respectively at the $p^+$-type layers 23 and 24; and LDD regions 25a to 32a of the $n^-$-conductivity type are formed respectively at the $n^+$-type layers 25 to 32.

A STI (Shallow Trench Isolation; an element separation insulator) 41 is provided between the n-type well 11 and the p-type well 12. Also, a STI for partitioning each transistor from the periphery is formed on the n-type well 11 and on the p-type well 12. For example, a STI 42 is provided between the $p^+$-type layer 22 and the $p^+$-type layer 23. The first transistor 91 and the fourth transistor 94 are electrically isolated by the STI 42. A STI 43 is provided between the $n^+$-type layer 26 and the $n^+$-type layer 27. The second transistor 92 and the fifth transistor 95 are electrically isolated by the STI 43.

A STI 44 is provided between the $n^+$-type layer 28 and the $n^+$-type layer 29. The fifth transistor 95 and the third transistor 93 are electrically isolated by the STI 44. A STI 45 is provided between the $n^+$-type layer 30 and the $n^+$-type layer 31. The third transistor 93 and the sixth transistor 96 are electrically isolated by the STI 45. Also, a STI 46 is formed to surround the $n^+$-type contact layer 36. A STI 47 is formed to surround the $p^+$-type contact layer 37. For example, the STIs 41 to 47 are formed of silicon oxide (SiO).

A gate electrode 51 of the first transistor 91 is provided in a region directly above a region of the n-type well 11 between the $p^+$-type layer 21 and the $p^+$-type layer 22, i.e., the channel region of the first transistor 91. A gate electrode 52 of the fourth transistor 94 is provided in a region directly above a region of the n-type well 11 between the $p^+$-type layer 23 and the $p^+$-type layer 24, i.e., the channel region of the fourth transistor 94. A gate electrode 53 of the second transistor 92 is provided in a region directly above a region of the p-type well 12 between the $n^+$-type layer 25 and the $n^+$-type layer 26, i.e., the channel region of the second transistor 92. A gate electrode 54 of the fifth transistor 95 is provided in a region directly above a region of the p-type well 12 between the $n^+$-type layer 27 and the $n^+$-type layer 28, i.e., the channel region of the fifth transistor 95.

A gate electrode 55 of the third transistor 93 is provided in a region directly above a region of the p-type well 12 between the $n^+$-type layer 29 and the $n^+$-type layer 30, i.e., the channel region of the third transistor 93. A gate electrode 56 of the sixth transistor 96 is provided in a region directly above a region of the p-type well 12 between the $n^+$-type layer 31 and the $n^+$-type layer 32, i.e., the channel region of the sixth transistor 96. The gate electrodes 51 to 56 are formed of a conductive material such as, for example, polysilicon, etc.

As shown in FIG. 1 and FIG. 2, a gate insulating film 61 is provided on the n-type well 11 and on the high breakdown voltage region 13 of the p-type well 12. The gate insulating film 61 is disposed at least between the n-type well 11 and the gate electrode 51, between the n-type well 11 and the gate electrode 52, between the p-type well 12 and the gate electrode 53, and between the p-type well 12 and the gate electrode 54. The gate insulating film 61 functions as the gate insulating films of the first transistor 91, the fourth transistor 94, the second transistor 92, and the fifth transistor 95.

A gate insulating film 62 is provided on the low breakdown voltage region 14 of the p-type well 12. The gate insulating film 62 is disposed at least between the p-type well 12 and the gate electrode 55 and between the p-type well 12 and the gate electrode 56. The gate insulating film 62 functions as the gate insulating films of the third transistor 93 and the sixth transistor 96.

The gate insulating film 62 is thinner than the gate insulating film 61. For example, a thickness t1 of the gate insulating film 61 is not less than 4 times and not more than 7 times a thickness t2 of the gate insulating film 62. Therefore, as described above, the breakdown voltages of the third transistor 93 and the sixth transistor 96 are lower than the breakdown voltages of the first transistor 91, the fourth transistor 94, the second transistor 92, and the fifth transistor 95. The gate insulating films 61 and 62 are formed of, for example, an insulating material such as silicon oxide, etc., and are, for example, silicon thermal oxide films. A level difference that is caused by the multi-gate processes is formed at the boundary (not illustrated) between the gate insulating film 61 and the gate insulating film 62.

An inter-layer insulating film 65 is provided on the gate insulating films 61 and 62 to cover the gate electrodes 51 to 56. Interconnects 71 to 78 are provided inside the inter-layer insulating film 65. The configurations of the interconnects 71 to 78 are arbitrary; and each include, for example, an interconnect portion extending in a horizontal direction and a contact portion extending in a vertical direction.

The interconnect 71 is connected to the n-type well 11 via the $n^+$-type contact layer 36. The interconnect 71 is connected also to the $p^+$-type layer 21 and the $p^+$-type layer 23. A positive power supply potential VDD (a first power supply potential) is applied to the interconnect 71.

The interconnect 72 is connected to the $p^+$-type layer 24, the $n^+$-type layer 28, and the gate electrode 51. An output signal VoutB is output from the interconnect 72.

The interconnect 73 is connected to the $p^+$-type layer 22, the $n^+$-type layer 26, and the gate electrode 52. An output signal VoutA is output from the interconnect 73. The output signal VoutA and the output signal VoutB are complimentary to each other.

The interconnect 74 is connected to the $n^+$-type layer 25 and the $n^+$-type layer 30.

The interconnect 75 is connected to the gate electrode 53 and the gate electrode 55. An input signal VinB is input to the interconnect 75.

The interconnect 76 is connected to the $n^+$-type layer 27 and the $n^+$-type layer 32.

The interconnect 77 is connected to the gate electrode 54 and the gate electrode 56. An input signal VinA is input to the interconnect 77. The input signal VinA and the input signal VinB are complimentary to each other.

The interconnect 78 is connected to the p-type well 12 via the $p^+$-type contact layer 37. The interconnect 78 is connected also to the $n^+$-type layer 29 and the $n^+$-type layer 31. A ground potential GND (a second power supply potential) is applied to the interconnect 78. The power supply potential (the second power supply potential) that is applied to the interconnect 78 is not limited to the ground potential GND, and is a potential lower than the power supply potential VDD (the first power supply potential) applied to the interconnect 71.

According to the configuration described above, a level shift circuit is formed in the semiconductor device 1.

Figure 3:
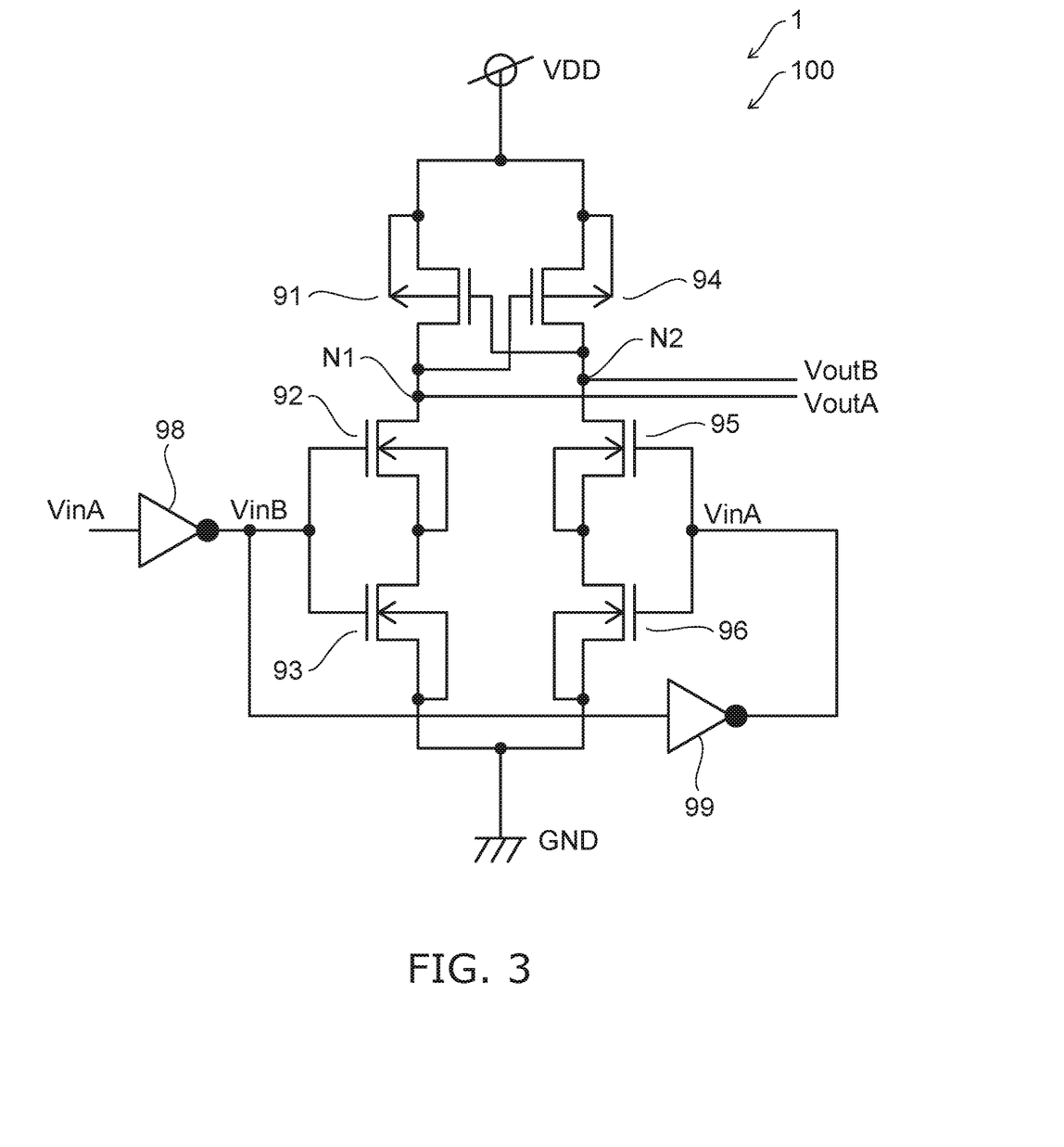
FIG. 3 is a circuit diagram showing the level shift circuit formed in the semiconductor device according to the embodiment.

FIG. 3 is a circuit diagram showing the level shift circuit formed in the semiconductor device according to the embodiment.

As shown in FIG. 3, the p-channel first transistor 91, the n-channel second transistor 92, the n-channel third transistor 93, the p-channel fourth transistor 94, the n-channel fifth transistor 95, and the n-channel sixth transistor 96 are provided in the level shift circuit 100 formed in the semiconductor device 1. These transistors are as described above. All of these transistors are of the enhancement type. The breakdown voltages of the third transistor 93 and the sixth transistor 96 are lower than the breakdown voltages of the first transistor 91, the second transistor 92, the fourth transistor 94, and the fifth transistor 95.

The first transistor 91, the second transistor 92, and the third transistor 93 are connected in series between the positive power supply potential VDD (the first power supply potential) and the ground potential GND (the second power supply potential); and the fourth transistor 94, the fifth transistor 95, and the sixth transistor 96 also are connected in series between the power supply potential VDD and the ground potential GND.

The circuit configuration of the level shift circuit 100 will now be described in more detail.

The power supply potential VDD is applied to the channels (the n-type well 11) of the first transistor 91 and the fourth transistor 94 via the interconnect 71 and the $n^+$-type contact layer 36. The ground potential GND is applied to the channels (the p-type well 12) of the second transistor 92, the fifth transistor 95, the third transistor 93, and the sixth transistor 96 via the interconnect 78 and the $p^+$-type contact layer 37.

The power supply potential VDD is applied to the source (the $p^+$-type layer 21) of the first transistor 91 via the interconnect 71.

The drain (the $n^+$-type layer 26) of the second transistor 92 is connected to the drain (the $p^+$-type layer 22) of the first transistor 91 via the interconnect 73.

The drain (the $n^+$-type layer 30) of the third transistor 93 is connected to the source (the $n^+$-type layer 25) of the second transistor 92 via the interconnect 74; and the ground potential GND is applied to the source (the $n^+$-type layer 29) of the third transistor 93 via the interconnect 78.

The power supply potential VDD is applied to the source (the $p^+$-type layer 23) of the fourth transistor 94 via the interconnect 71; the drain (the $p^+$-type layer 24) of the fourth transistor 94 is connected to the gate (the gate electrode 51) of the first transistor 91 via the interconnect 72; and the gate (the gate electrode 52) of the fourth transistor 94 is connected to the drain (the $p^+$-type layer 22) of the first transistor 91 via the interconnect 73.

The drain (the $n^+$-type layer 28) of the fifth transistor 95 is connected to the drain (the $p^+$-type layer 24) of the fourth transistor 94 via the interconnect 72.

The drain (the $n^+$-type layer 32) of the sixth transistor 96 is connected to the source (the $n^+$-type layer 27) of the fifth transistor 95 via the interconnect 76; and the ground potential GND is applied to the source (the $n^+$-type layer 31) of the sixth transistor 96 via the interconnect 78.

An inverter 98 and an inverter 99 also are provided in the level shift circuit 100. The output terminal of the inverter 98 is connected to the gate (the gate electrode 53) of the second transistor 92, the gate (the gate electrode 55) of the third transistor 93, and the input terminal of the inverter 99. The output terminal of the inverter 99 is connected to the gate (the gate electrode 54) of the fifth transistor 95 and the gate (the gate electrode 56) of the sixth transistor 96.

Thereby, the input signal VinA and the input signal VinB which are complimentary to each other are generated by the inverter 98 and the inverter 99 when the input signal VinA is input to the input terminal of the inverter 98. The input signal VinB is input to the gate (the gate electrode 53) of the second transistor 92 and the gate (the gate electrode 55) of the third transistor 93. The input signal VinA is input to the gate (the gate electrode 54) of the fifth transistor 95 and the gate (the gate electrode 56) of the sixth transistor 96.

The output signal VoutA is output from a connection point N1 (the interconnect 73) between the drain (the p$^+$-type layer 22) of the first transistor 91 and the drain (the n$^+$-type layer 26) of the second transistor 92. The output signal VoutB is output from a connection point N2 (the interconnect 72) between the drain (the p$^+$-type layer 24) of the fourth transistor 94 and the drain (the n$^+$-type layer 28) of the fifth transistor 95. The output signal VoutA and the output signal VoutB are complimentary to each other.

For example, the absolute value of the potential difference between the output signal VoutA and the output signal VoutB is greater than the absolute value of the potential difference between the input signal VinA and the input signal VinB. In an example, the high level is 1.5 V and the low level is 0 V for the input signals VinA and VinB. The power supply potential VDD is 5 V. Accordingly, the high level is about 5 V and the low level is about 0 V for the output signals VoutA and VoutB.

Operations of the semiconductor device 1 according to the embodiment will now be described.

First, a level shift operation will be described.

The first to sixth transistors 91 to 96 which are included in the level shift circuit 100 all are of the enhancement type and therefore are in the OFF-state when the gate-source potential is zero.

When the input signal VinA is the low level, the input signal VinB is the high level; therefore, the second transistor 92 and the third transistor 93 which have n-channels are set to the ON-state; and the potential of the connection point N1 approaches the ground potential GND. The p-channel fourth transistor 94 is set to the ON-state thereby. Also, the fifth transistor 95 and the sixth transistor 96 which have n-channels are set to the OFF-state by the low-level input signal VinA. Thereby, the potential of the connection point N2 approaches the power supply potential VDD; and the p-channel first transistor 91 is set to the OFF-state. As a result, the potential of the output signal VoutA is set to substantially the ground potential GND (the low level); and the potential of the output signal VoutB is set to substantially the power supply potential VDD (the high level).

On the other hand, when the input signal VinA is the high level, the fifth transistor 95 and the sixth transistor 96 which have n-channels are set to the ON-state. Thereby, the potential of the connection point N2 approaches the ground potential GND; and the p-channel first transistor 91 is set to the ON-state. Also, because the input signal VinB is the low level, the second transistor 92 and the third transistor 93 which have n-channels are set to the OFF-state. Thereby, the potential of the connection point N1 approaches the power supply potential VDD; and the p-channel fourth transistor 94 is set to the OFF-state. As a result, the potential of the output signal VoutA is set to substantially the power supply potential VDD (the high level); and the potential of the output signal VoutB is set to substantially the ground potential GND (the low level).

Effects of ionizing radiation will now be described.

FIGS. 4A to 4D show a process in which a fixed charge is formed in a gate insulating film by ionizing radiation.

Figure 5A:
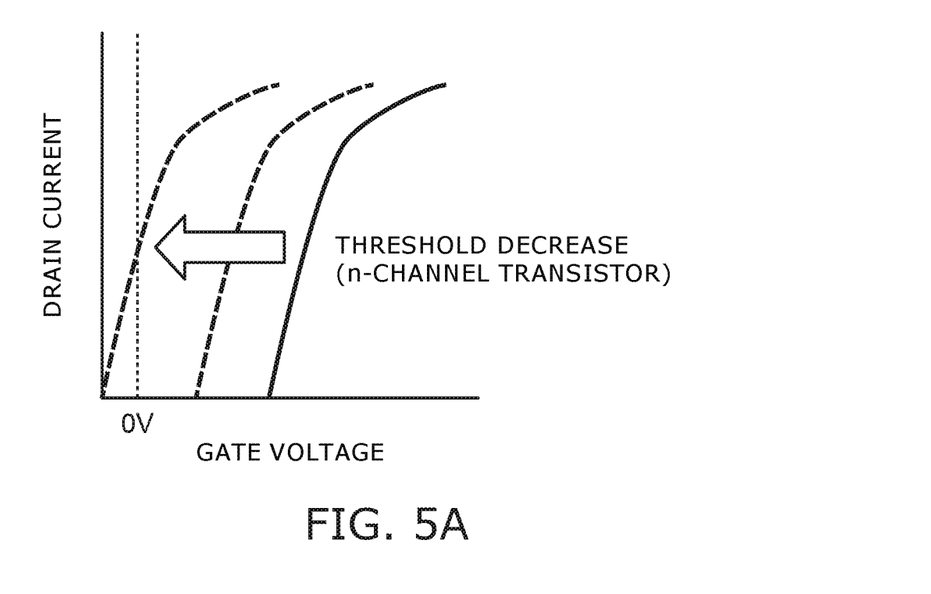
FIG. 5A is a graph showing the change of the threshold due to the fixed charge, in which the horizontal axis is the gate voltage, and the vertical axis is the drain current.
Figure 5B:
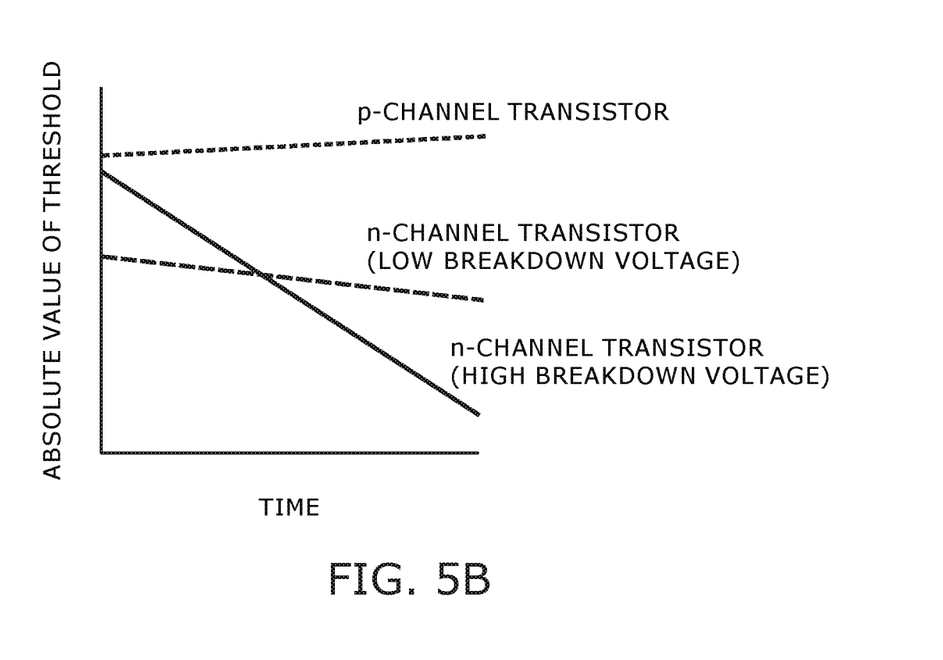
FIG. 5B is a graph showing the change over time of the threshold, in which the horizontal axis is time, and the vertical axis is the absolute value of the threshold.

FIG. 5A is a graph showing the change of the threshold due to the fixed charge, in which the horizontal axis is the gate voltage, and the vertical axis is the drain current; and FIG. 5B is a graph showing the change over time of the threshold, in which the horizontal axis is time, and the vertical axis is the absolute value of the threshold.

Figure 4A:
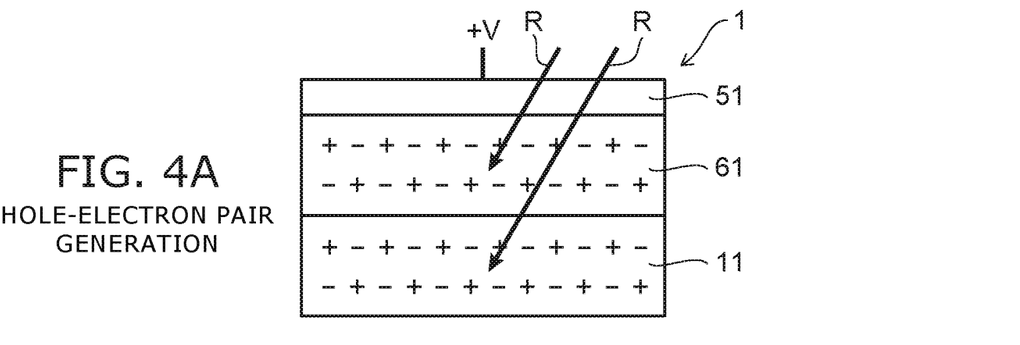
FIGS. 4A to 4D show a process in which a fixed charge is formed in a gate insulating film by ionizing radiation.

When ionizing radiation R enters the semiconductor device 1 as shown in FIG. 4A, hole-electron pairs are generated in the gate insulating films 61 and 62 and in the silicon portions such as the semiconductor substrate 10, the n-type well 11, the p-type well 12, the p$^+$-type layer 21 to the n$^+$-type layer 32, etc.

Figure 4B:
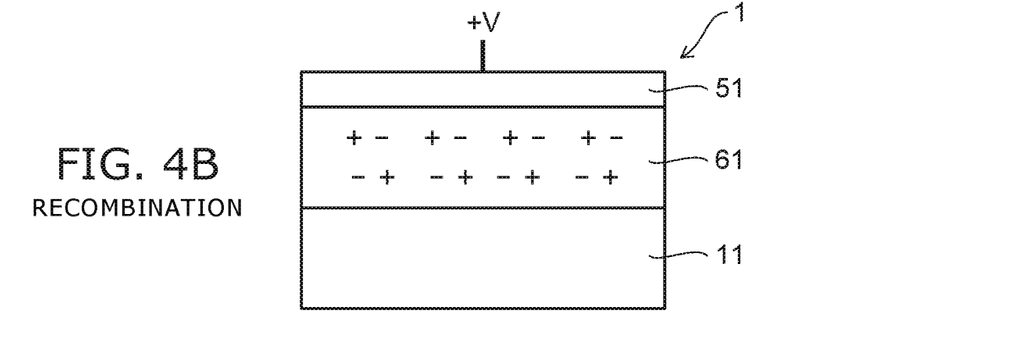

Subsequently, the hole-electron pairs recombine as shown in FIG. 4B. At this time, the silicon portion is connected to an external potential such as the ground potential, etc.; therefore, the hole-electron pairs easily recombine and are annihilated. Conversely, the gate insulating film is insulative and is not connected to an external potential; therefore, the hole-electron pairs do not recombine easily; and holes and electrons easily remain.

Figure 4C:
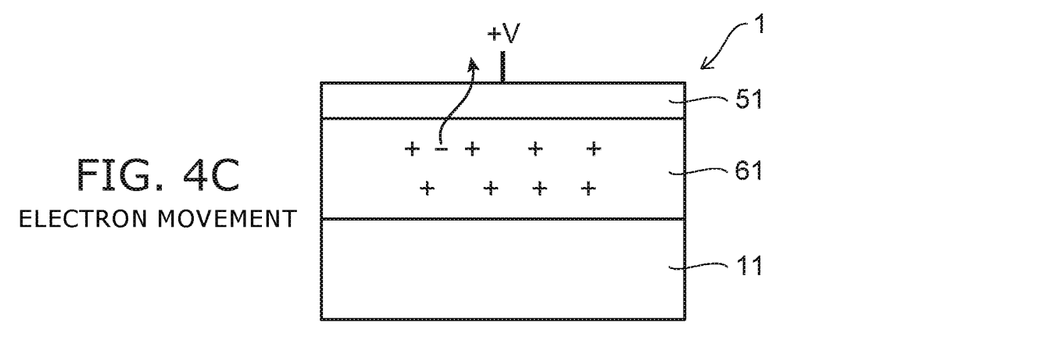

Then, as the level shift circuit 100 is driven as shown in FIG. 4C, the electrons in the gate insulating film are discharged externally via the gate electrode when a positive potential is applied to the gate electrode. However, in the gate insulating film, the holes substantially are not discharged and remain.

Figure 4D:
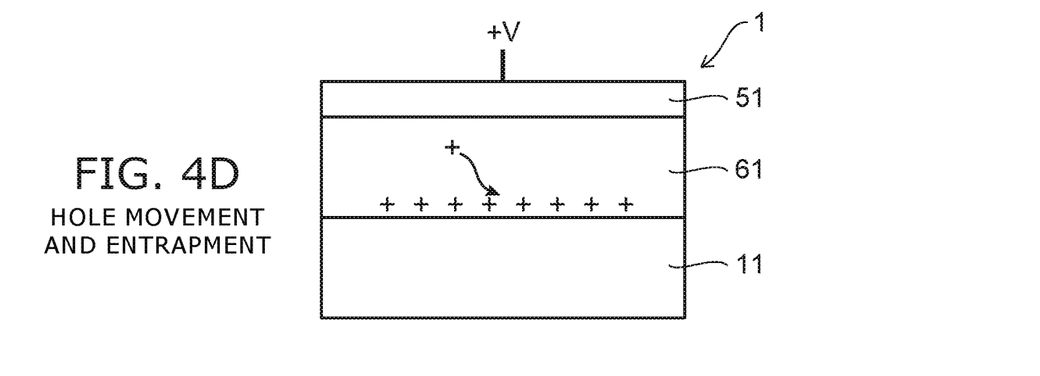

Also, due to the positive potential applied to the gate electrode as shown in FIG. 4D, the holes in the gate insulating film move toward the interface at the silicon portion and are trapped by trap sites. Thereby, the positive charge is immobilized in the gate insulating film. Thus, by repeating the incidence of the ionizing radiation R and the driving of the level shift circuit 100, a positive fixed charge is stored in the gate insulating film.

As a result, the thresholds of the transistors change as shown in FIG. 5A. For example, the thresholds of the n-channel transistors decrease. Thereby, when the input signal is the low level, the n-channel transistors are not set completely to the OFF-state; and the operation of the level shift circuit 100 becomes unstable. On the other hand, the thresholds of the p-channel transistors increase.

As shown in FIG. 5B, the degree of the change over time of the threshold due to the ionizing radiation is different according to the conductivity type of the transistor and is dependent also on the film thickness of the gate insulating film. The change amounts of the thresholds of the n-channel transistors are larger than the change amount of the threshold of the p-channel transistor. Also, among the n-channel transistors, the trapped amount of the charge decreases as the thickness of the gate insulating film is reduced; therefore, the fixed charge is not stored easily; and the change amount of the threshold is small.

In the semiconductor device 1 according to the embodiment, the second transistor 92 which includes the thick gate insulating film 61 is provided; the third transistor 93 which includes the thin gate insulating film 62 is provided; and the same input signal VinB is input to the gates of these transistors. Also, the fifth transistor 95 which includes the thick gate insulating film 61 is provided; the sixth transistor 96 which includes the thin gate insulating film 62 is provided; and the same input signal VinA is input to the gates of these transistors.

When a considerable amount of ionizing radiation is incident as time elapses from the manufacture of the semiconductor device 1, for the second transistor 92 and the fifth transistor 95 including the thick gate insulating film 61, the thresholds decrease, and the states cannot be set sufficiently to the OFF-state when the input signal is the low level. However, for the third transistor 93 and the sixth transistor 96 including the thin gate insulating film 62, the thresholds do not decrease much; therefore, a sufficient OFF-state can be realized when the input signal is the low level.

The breakdown voltages of the third transistor 93 and the sixth transistor 96 including the thin gate insulating film 62 are lower than the breakdown voltages of the second transistor 92 and the fifth transistor 95 including the thick gate insulating film 61. Therefore, in the level shift circuit 100, the third transistor 93 which includes the thin gate insulating film 62 is connected on the low potential side of the second transistor 92 including the thick gate insulating film 61; and the sixth transistor 96 which includes the thin gate insulating film 62 is connected on the low potential side of the fifth transistor 95 including the thick gate insulating film 61. Therefore, when driving the level shift circuit 100, the voltage that is applied to the thin gate insulating film 62 is lower than the voltage applied to the thick gate insulating film 61. Dielectric breakdown of the thin gate insulating film 62 can be suppressed thereby.

Thus, for the entire circuit made of the second transistor 92 and the third transistor 93 and the entire circuit made of the fifth transistor 95 and the sixth transistor 96, the necessary breakdown voltage can be ensured; and the leakage current in the OFF-state can be suppressed. Originally, the effects of the ionizing radiation on the p-channel transistors are small. As a result, for the level shift circuit 100 as an entirety, the effects of the ionizing radiation can be suppressed; and stable operations are possible.

In the embodiment, all of the first to sixth transistors 91 to 96 included in the level shift circuit 100 are of the enhancement type; therefore, when the input signal VinA is the low level, the first transistor 91, the fifth transistor 95, and the sixth transistor 96 can be set reliably to the OFF-state; and when the input signal VinA is the high level, the second transistor 92, the third transistor 93, and the fourth transistor 94 can be set reliably to the OFF-state. Also, because each transistor is of the enhancement type, the increase of the leakage current in the OFF-state can be suppressed even when the threshold decreases somewhat due to the ionizing radiation.

Effects of the embodiment will now be described.

In the embodiment as described above, the n-channel transistors that are included in the level shift circuit 100 have a two-stage configuration of a transistor including the thick gate insulating film 61 and a transistor including the thin gate insulating film 62. Thereby, while ensuring the breakdown voltage of the level shift circuit 100 as an entirety, the decrease of the threshold due to the ionizing radiation can be suppressed; and the degradation over time can be suppressed. Also, by configuring the level shift circuit 100 using enhancement mode transistors, the OFF-state of each transistor can be realized reliably; and the increase of the leakage current caused by ionizing radiation can be suppressed.

According to the embodiments described above, a semiconductor device can be realized in which the level shift circuit can operate stably over a long period of time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
an n-type well;
a p-type well;
first to fourth layers provided on the n-type well, the first to fourth layers being of a p-type;
fifth to twelfth layers provided on the p-type well, the fifth to twelfth layers being of an n-type;
a first gate electrode provided in a region directly above a region of the n-type well between the first layer and the second layer;
a second gate electrode provided in a region directly above a region of the n-type well between the third layer and the fourth layer;
a third gate electrode provided in a region directly above a region of the p-type well between the fifth layer and the sixth layer;
a fourth gate electrode provided in a region directly above a region of the p-type well between the seventh layer and the eighth layer;
a fifth gate electrode provided in a region directly above a region of the p-type well between the ninth layer and the tenth layer;
a sixth gate electrode provided in a region directly above a region of the p-type well between the eleventh layer and the twelfth layer;
a first gate insulating film provided between the n-type well and the first gate electrode, between the n-type well and the second gate electrode, between the p-type well and the third gate electrode, and between the p-type well and the fourth gate electrode;
a second gate insulating film provided between the p-type well and the fifth gate electrode and between the p-type well and the sixth gate electrode, the second gate insulating film being thinner than the first gate insulating film;
a first interconnect connected to the n-type well, the first layer, and the third layer;
a second interconnect connected to the fourth layer, the eighth layer, and the first gate electrode;
a third interconnect connected to the second layer, the sixth layer, and the second gate electrode;
a fourth interconnect connected to the fifth layer and the tenth layer;
a fifth interconnect connected to the third gate electrode and the fifth gate electrode;
a sixth interconnect connected to the seventh layer and the twelfth layer;
a seventh interconnect connected to the fourth gate electrode and the sixth gate electrode; and
an eighth interconnect connected to the p-type well, the ninth layer, and the eleventh layer.

2. The device according to claim 1, wherein
a first power supply potential is applied to the first interconnect,
a first output signal is output from the second interconnect,
a second output signal is output from the third interconnect and is complimentary to the first output signal,
a first input signal is input to the fifth interconnect,
a second input signal is input to the seventh interconnect and is complimentary to the first input signal, and
a second power supply potential is applied to the eighth interconnect and is lower than the first power supply potential.

3. The device according to claim 2, wherein an absolute value of a potential difference between the first output signal and the second output signal is greater than an absolute value of a potential difference between the first input signal and the second input signal.

4. The device according to claim 1, further comprising a first element separation insulator provided between the n-type well and the p-type well.

5. The device according to claim 4, further comprising:
a second element separation insulator provided between the second layer and the third layer;
a third element separation insulator provided between the sixth layer and the seventh layer;
a fourth element separation insulator provided between the eighth layer and the ninth layer; and
a fifth element separation insulator provided between the tenth layer and the eleventh layer.

6. The device according to claim 1, wherein an impurity concentration of a first region of the p-type well where the fifth to eighth layers are disposed is equal to or lower than an impurity concentration of a second region of the p-type well where the ninth to twelfth layers are disposed.

7. The device according to claim 1, wherein impurity concentrations of the fifth to eighth layers are substantially equal to impurity concentrations of the ninth to twelfth layers.

8. The device according to claim 1, wherein first to sixth transistors are of an enhancement type, the first transistor including the n-type well, the first layer, the second layer, the first gate insulating film, and the first gate electrode, the second transistor including the p-type well, the fifth layer, the sixth layer, the first gate insulating film, and the third gate electrode, the third transistor including the p-type well, the ninth layer, the tenth layer, the second gate insulating film, and the fifth gate electrode, the fourth transistor including the n-type well, the third layer, the fourth layer, the first gate insulating film, and the second gate electrode, the fifth transistor including the p-type well, the seventh layer, the eighth layer, the first gate insulating film, and the fourth gate electrode, the sixth transistor including the p-type well, the eleventh layer, the twelfth layer, the second gate insulating film, and the sixth gate electrode.

9. A semiconductor device, comprising:
a first transistor of a p-channel type and of an enhancement type, a first power supply potential being applied to a source of the first transistor;
a second transistor of an n-channel type and of the enhancement type, a drain of the second transistor being connected to a drain of the first transistor, a first input signal being input to a gate of the second transistor;
a third transistor of the n-channel type and of the enhancement type, a drain of the third transistor being connected to a source of the second transistor, a second power supply potential being lower than the first power supply potential and being applied to a source of the third transistor, the first input signal being input to a gate of the third transistor, a breakdown voltage of the third transistor being lower than a breakdown voltage of the second transistor;
a fourth transistor of the p-channel type and of the enhancement type, a source of the fourth transistor being connected to the first power supply potential, a drain of the fourth transistor being connected to a gate of the first transistor, a gate of the fourth transistor being connected to a drain of the first transistor;
a fifth transistor of the n-channel type and of the enhancement type, a drain of the fifth transistor being connected to a drain of the fourth transistor, a second input signal being complimentary to the first input signal and being input to a gate of the fifth transistor; and
a sixth transistor of the n-channel type and of the enhancement type, a drain of the sixth transistor being connected to a source of the fifth transistor, the second power supply potential being applied to a source of the sixth transistor, the second input signal being input to a gate of the sixth transistor, a breakdown voltage of the sixth transistor being lower than a breakdown voltage of the fifth transistor,
a first output signal being output from a drain of the fourth transistor,
a second output signal being output from a drain of the first transistor and being complimentary to the first output signal.

10. The device according to claim 9, wherein an absolute value of a potential difference between the first output signal and the second output signal is greater than an absolute value of a potential difference between the first input signal and the second input signal.

* * * * *